United States Patent
Arimoto (10) Patent No.: US 11,690,194 B2
(45) Date of Patent: Jun. 27, 2023

(54) ELECTRICAL APPARATUS INCLUDING FAN UNIT AND CONTROL PANEL INCLUDING ELECTRICAL APPARATUS

(71) Applicant: FANUC CORPORATION, Yamanashi (JP)

(72) Inventor: Kohei Arimoto, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 16/991,024

(22) Filed: Aug. 12, 2020

(65) Prior Publication Data

US 2021/0100131 A1   Apr. 1, 2021

(30) Foreign Application Priority Data

Sep. 26, 2019   (JP) ................................ 2019-175998

(51) Int. Cl.
 *H05K 7/20* (2006.01)
(52) U.S. Cl.
 CPC ..... *H05K 7/20145* (2013.01); *H05K 7/20172* (2013.01); *H05K 7/20209* (2013.01)
(58) Field of Classification Search
 CPC ........... H05K 7/20145; H05K 7/20172; H05K 7/20209; H05K 7/1482; H05K 7/1465; H05K 7/20136; H05K 5/0217
 See application file for complete search history.

(56) References Cited

U.S. PATENT DOCUMENTS

| | | | | |
|---|---|---|---|---|
| 6,563,710 B1 * | 5/2003 | Okuda | ............... | H05K 7/20918 361/600 |
| 10,499,525 B1 * | 12/2019 | Singh | ................... | H05K 7/1492 |
| 2011/0036961 A1 * | 2/2011 | Chowaniec | ......... | H05K 7/1484 248/309.1 |
| 2016/0212865 A1 * | 7/2016 | Miyake | ................ | H05K 7/1471 |
| 2016/0330869 A1 * | 11/2016 | Williams | ........... | H05K 7/20472 |
| 2017/0311462 A1 * | 10/2017 | Kamensek | ............ | H02B 1/052 |
| 2018/0168068 A1 * | 6/2018 | Linares | ................. | H05K 7/183 |

FOREIGN PATENT DOCUMENTS

| | | | | |
|---|---|---|---|---|
| EP | 1258957 A1 * | 11/2002 | ............ | H02B 1/205 |
| EP | 2385753 A2 * | 11/2011 | ............ | H05K 7/209 |
| JP | S6188291 U | 6/1986 | | |
| JP | H03-001688 U | 1/1991 | | |
| JP | H1023618 A | 1/1998 | | |
| JP | 2000132211 A | 5/2000 | | |

(Continued)

OTHER PUBLICATIONS

Carter, Rudolph, "Switch Assembly", Nov, 20, 2002, Entire Document (translation of EP 1258957) (Year: 2002).*

*Primary Examiner* — Stephen S Sul
(74) *Attorney, Agent, or Firm* — Hauptman Ham, LLP (57) ABSTRACT

An electrical apparatus includes an electrical device that generates heat and a fan unit. A case of the electrical device includes a first opening and a second opening. A case of the fan unit includes a third opening and a fourth opening. The case of the electrical device and the case of the fan unit are configured such that a space sandwiched between a recess of the case of the electrical device and the support rail and a space sandwiched between a recess of the case of the fan unit and the support rail constitute an air flow path.

15 Claims, 10 Drawing Sheets

(56) References Cited

FOREIGN PATENT DOCUMENTS

| JP | 200185878 A | 3/2001 |
|----|-------------|--------|
| JP | 2004-146631 A | 5/2004 |
| JP | 3617452 B2 | 2/2005 |
| JP | 2006261215 A | 9/2006 |
| JP | 201512025 A | 1/2015 |

\* cited by examiner

ELECTRICAL APPARATUS INCLUDING FAN UNIT AND CONTROL PANEL INCLUDING ELECTRICAL APPARATUS

RELATED APPLICATIONS

The present application claims priority to Japanese Application Number 2019-175998, filed Sep. 26, 2019, the disclosure of which is hereby incorporated by reference herein in its entirety.

BACKGROUND OF THE INVENTION

1. Field of the Invention

The present invention relates to an electrical apparatus including a fan unit and a control panel including the electrical apparatus.

2. Description of the Related Art

Various electrical devices are arranged inside a control panel of a machine such as a machine tool or a robot apparatus. For example, there are arranged an output unit that receives a signal from a controller and transmits a signal to an electric circuit that drives a driving machine such as a motor, an input unit that receives a signal from a sensor or the like and transmits a signal to the controller, or the like.

A device that generates heat is included in the electrical device of the control panel. Thus, it is known to arrange a cooling fan that generates an air flow inside the control panel, thereby cooling the electrical device inside the control panel (e.g., Japanese Unexamined Patent Publication No. 10-23618A).

It is known to arrange a support rail called a DIN rail on the wall surface of the control panel when fixing an electrical device to the housing of the control panel. The electrical device can be fixed to the support rail (e.g., Japanese Unexamined Patent Publication No. 2000-132211A). When arranging a plurality of electrical devices, the plurality of electrical devices can be arranged and fixed on the support rail (e.g., Japanese Unexamined Patent Publication No. 2001-85878A and Japanese Unexamined Utility Model Publication No. 61-88291U).

Even when the electrical device is fixed to the support rail, it is necessary to cool the electrical device. In the related art, methods have been proposed such that a slit hole is provided to a case of an electrical device so as to supply air to the inside of the electrical device, air is allowed to flow between adjacent electrical devices, and a radiator is attached to a support rail (e.g., Japanese Patent No. 3617452B, Japanese Unexamined Patent Publication No. 2015-12025A, and Japanese Unexamined Patent Publication No. 2006-261215 A).

SUMMARY OF THE INVENTION

In the related art, when fixing an electrical device to a support rail, a slit hole is often formed in a case of the electrical device, which allows natural convection to cool the electrical device. In natural convection, the flow rate of air does not increase largely, and a printed circuit board or the like arranged inside the electrical device may not be cooled sufficiently. When the electrical device cannot be cooled sufficiently, the temperature of the electrical device rises. In order to lower the temperature of the air inside the control panel, a device that cools the air inside the control panel has been arranged. Alternatively, derating in which the output current or the input current of the electrical device is set to a low value is required so that the temperature of the electrical device does not rise.

Particularly, when a plurality of the electrical devices are arranged on the support rail so as to be in contact with each other, the temperature of the electrical devices is likely to rise. However, there is a problem that even when a slit hole for discharging the air whose temperature has risen is formed on a surface where the electrical devices are in contact with each other, the effect of lowering the temperature is not great.

For example, when the plurality of electrical devices are arranged vertically and fixed to the support rail, a slit hole formed in the case of the electrical device is formed on a side face of the electrical device. Since other electrical devices are arranged above and below the electrical device, even when a slit hole is formed in the top face or the bottom face of the case, the cooling method by natural convection does not allow air to flow enough inside the electrical device. As a result, there is a problem that the temperature of the electrical device rises.

A first aspect of the present disclosure is an electrical apparatus fixed to a support rail. The electrical apparatus includes an electrical device that generates heat when driven, and a fan unit including a fan that causes a flow of air. The electrical device includes a case having a recess in which the support rail is arranged. The fan unit includes a case having a recess in which the support rail is arranged. The case of the electrical device includes a first opening formed in a bottom surface of the recess and a second opening formed in a surface that contacts a space outside the electrical device. The case of the fan unit includes a third opening formed in a bottom surface of the recess and a fourth opening formed in a surface that contacts a space outside the fan unit. The case of the electrical device and the case of the fan unit are formed such that, when the electrical device and the fan unit are fixed to the support rail, the space sandwiched between the recess of the case of the electrical device and the support rail, and the space between the recess of the case of the fan unit and the support rail constitute an air flow path. Both ends in a direction in which the air flow path extends are closed by at least one member of the case of the electrical device, the case of the fan unit, or a closing member that closes the air flow path.

A second aspect of the present disclosure is a control panel including the above-described electrical apparatus, a housing in which the electrical apparatus is arranged, and a support rail fixed to the housing.

DETAILED DESCRIPTION

With reference to FIGS. 1 to 14, an electrical apparatus and a control panel including the electrical apparatus according to an embodiment is described. The control panel according to the present embodiment is a control panel for controlling machines such as a robot and a machine tool.

Figure 1:
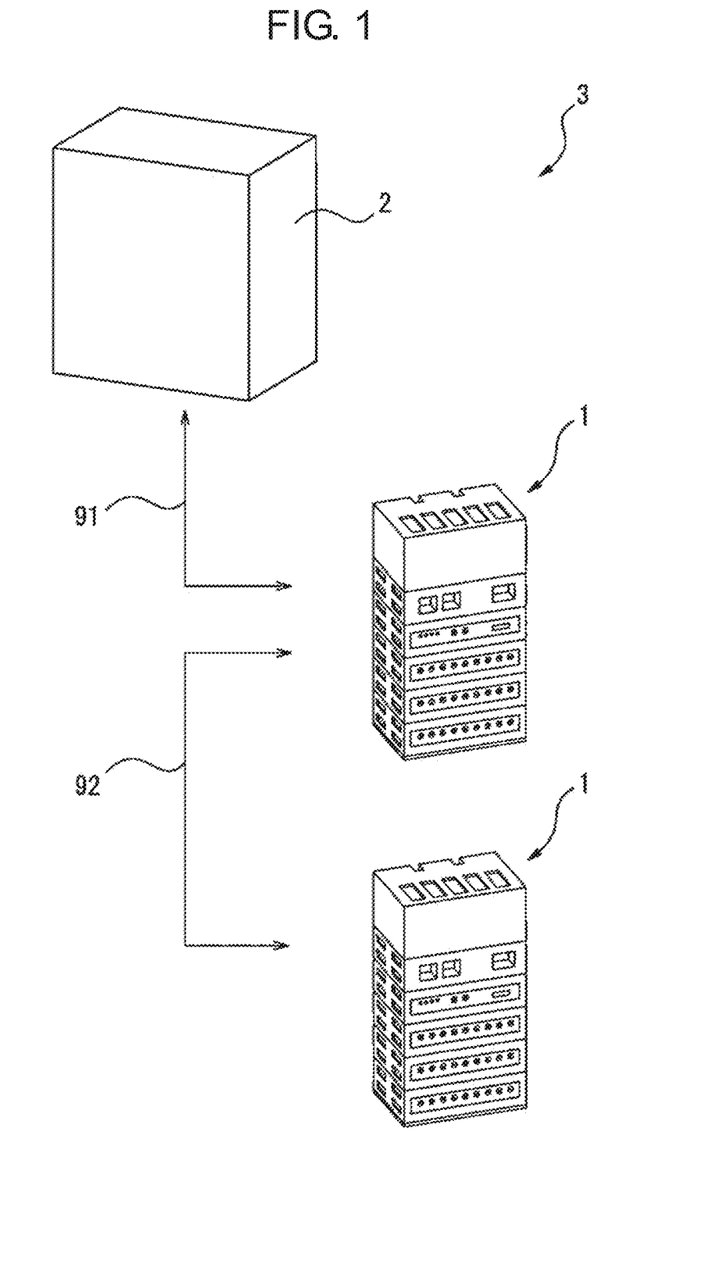
FIG. 1 is a schematic diagram of a controller and an electrical apparatus arranged inside a control panel according to an embodiment.

FIG. 1 illustrates a schematic diagram of an apparatus arranged in a control panel according to the present embodiment. A control panel 3 according to the present embodiment includes a controller 2. The controller 2 is constituted by an arithmetic processing device (computer) including a CPU (Central Processing Unit) as a processor, a numerical control device including a CPU, and a PLC (Programmable Logic Controller), or the like.

The control panel 3 includes an electrical apparatus 1 that receives a signal from the controller 2 and transmits a signal to the controller 2. The electrical apparatus 1 is formed so as to be able to communicate with the controller 2 as illustrated by an arrow 91. Also, a plurality of the electrical apparatuses 1 can be connected to the controller 2. The electrical apparatus 1 can be arranged, for example, for each apparatus to be controlled. When the control panel 3 includes the plurality of electrical apparatuses 1, each electrical apparatus 1 is configured so as to be communicable with the controller 2. In the example illustrated in FIG. 1, the electrical apparatuses 1 are configured so as to be communicable with each other, as illustrated by an arrow 92.

Figure 2:
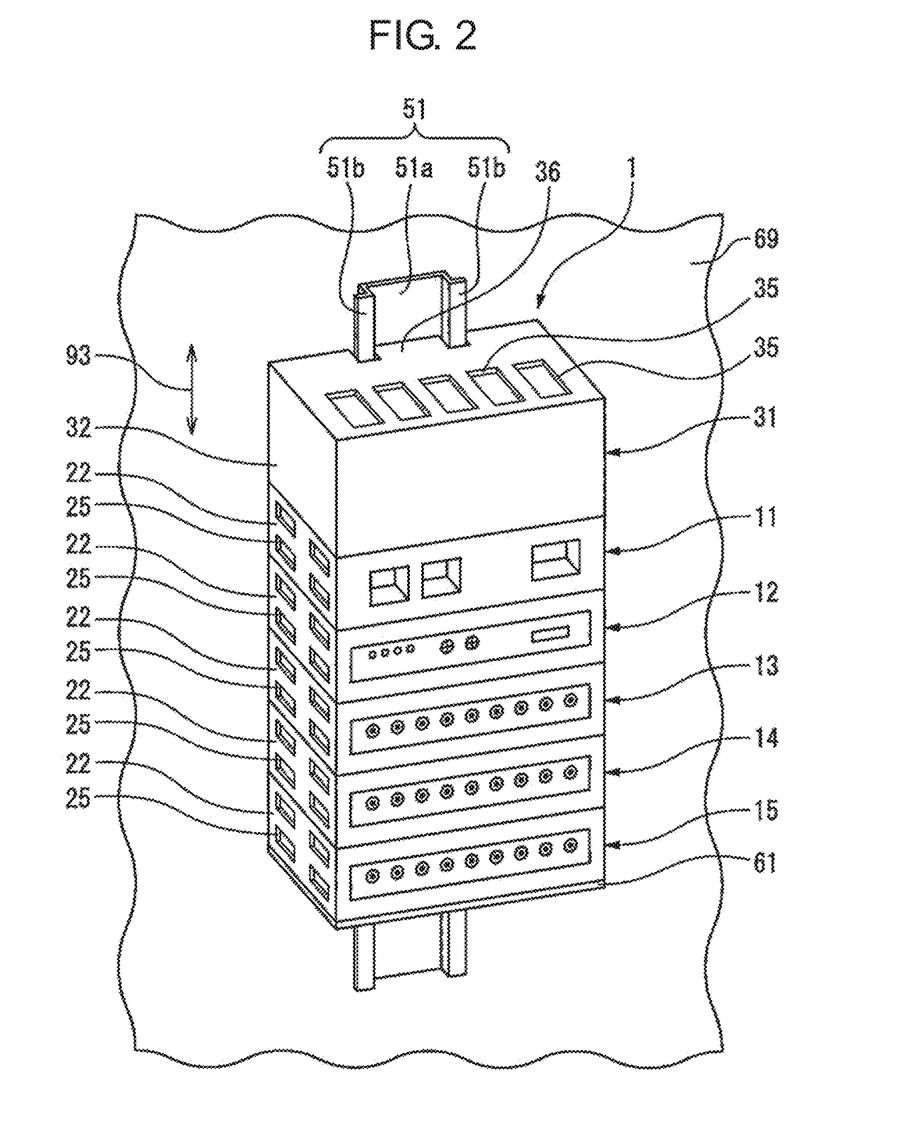
FIG. 2 is a perspective view of a first electrical apparatus according to an embodiment.

FIG. 2 illustrates an enlarged perspective view of the first electrical apparatus according to the present embodiment. The electrical apparatus 1 according to the present embodiment is fixed to a housing 69 of the control panel 3 via a support rail 51. The electrical apparatus 1 is fixed to the support rail 51. The support rail 51 according to the present embodiment is referred to as a DIN (Deutsche Industrie Normen) rail. The support rail 51 includes a base part 51a having a U-shaped cross section. The base part 51a has a shape in which both ends are bent. The support rail 51 includes an overhang portion 51b extending laterally from an end of the base part 51a. The base part 51a is fixed to the housing 69 of the control panel 3 by a fastening member such as a bolt. The support rail 51 supporting the first electrical apparatus 1 is fixed so as to extend along the vertical direction illustrated by the arrow 93.

The first electrical apparatus 1 according to the present embodiment is an input/output apparatus that receives a signal from a detector and transmits a signal to an electric circuit of a driving machine. The first electrical apparatus 1 includes a plurality of electrical devices 11 to 15. In the first electrical apparatus 1, a stacked body in which a plurality of the electrical devices 11 to 15 are stacked is fixed to the support rail 51.

The electrical device 11 is a communication unit that receives a signal from the controller 2 and transmits a signal to the electrical devices 12 to 15 and that receives a signal from the electrical devices 12 to 15 so as to transmit a signal to the controller 2. The electrical device 12 is a power supply unit that supplies electricity to the electrical devices 11, 13 to 15 and a fan unit 31.

The electrical devices 13 to 15 include an input unit that receives a signal from an external device such as a sensor and transmits a signal to the electrical device 11 as a communication unit. The input unit may be a digital input unit or an analog input unit. Alternatively, the electrical devices 13 to 15 include an output unit that receives a command from the controller 2 and transmits a signal to an electric circuit or the like that drives a device such as a motor. The output unit may be a digital output unit or an analog output unit. Alternatively, the electrical devices 13 to 15 may be input/output units having a function of both inputting signals and outputting signals.

Each of the electrical devices 13 to 15 is an electric unit that is any of an input unit, an output unit, or an input/output unit. Each of the electrical devices 13 to 15 is provided with a terminal to which a signal cable such as a loose wire is connected.

The plurality of electrical devices 11 to 15 are arranged so as to be in contact with each other. The electrical devices 11 to 15 according to the present embodiment are box-shaped electric units. The electrical devices 11 to 15 are formed so as to be capable of supplying electricity to or communicating with each other by coming into contact with each other. Such electrical devices 11 to 15 are referred to as slice IOs, IO cards, or the like.

The electrical device is not limited to the above-described configuration, and a device that generates heat when driven can be employed. For example, an amplifier that supplies electricity to a motor can be employed. A plurality of amplifiers may be stacked and secured to the support rail.

Figure 3:
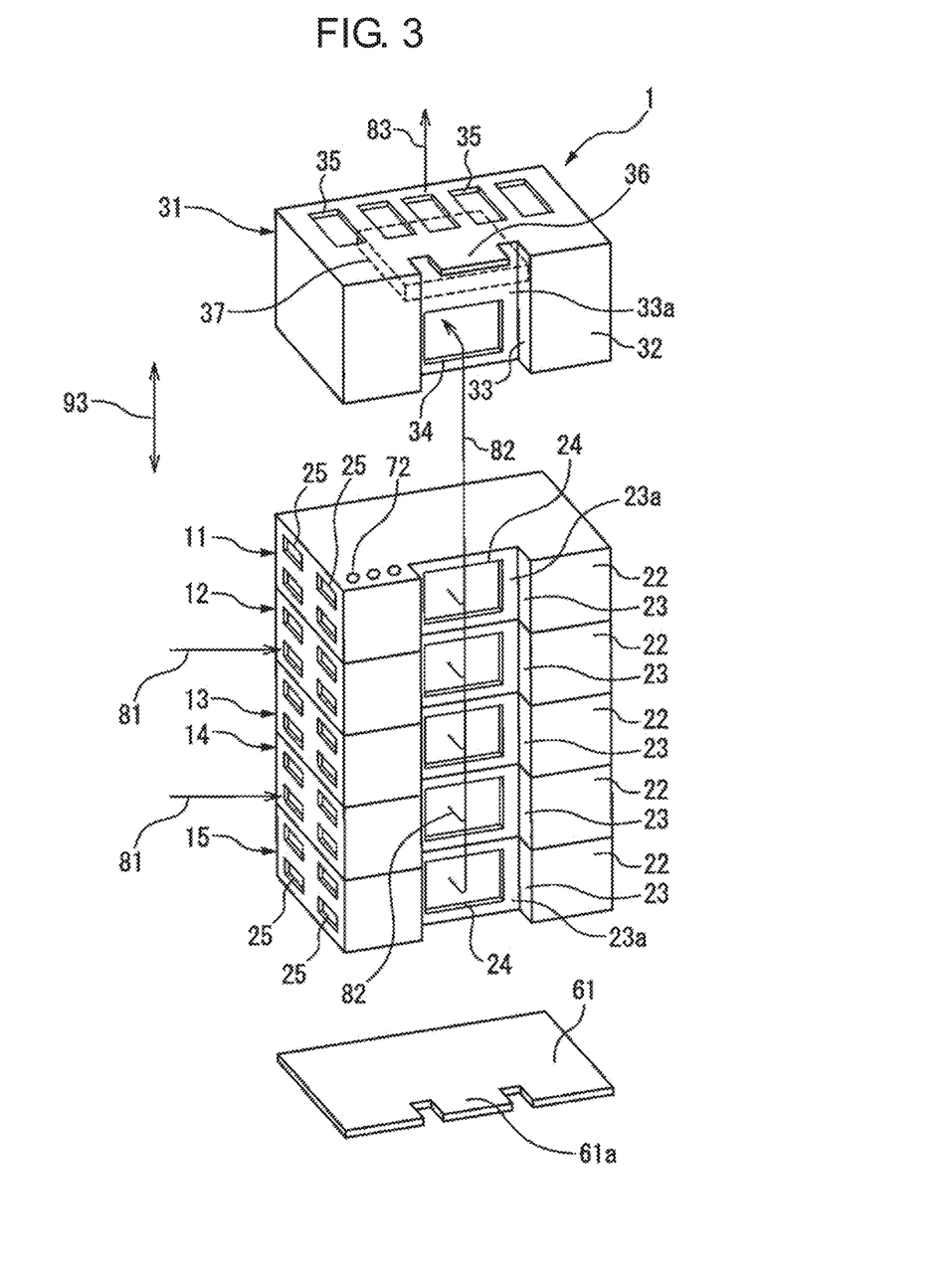
FIG. 3 is an exploded perspective view of the first electrical apparatus.
Figure 4:
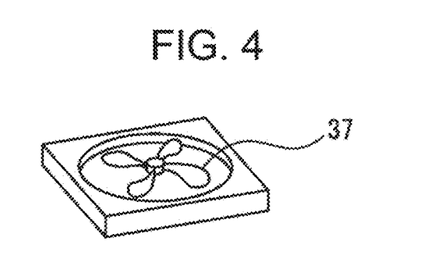
FIG. 4 is a perspective view of a fan arranged inside a first fan unit according to an embodiment.

FIG. 3 illustrates an exploded perspective view of the first electrical apparatus according to the present embodiment. FIG. 4 illustrates a perspective view of a fan disposed inside the fan unit. Referring to FIGS. 2 to 4, the first electrical apparatus 1 includes the first fan unit 31 that generates a flow of air for cooling the electrical devices 11 to 15. A fan 37 is disposed inside the fan unit 31. When the fan 37 rotates, an air flow can be formed. The fan unit 31 according to the present embodiment is box-shaped. The fan unit 31 is fixed to the support rail 51 in contact with the electrical device 11.

Figure 5:
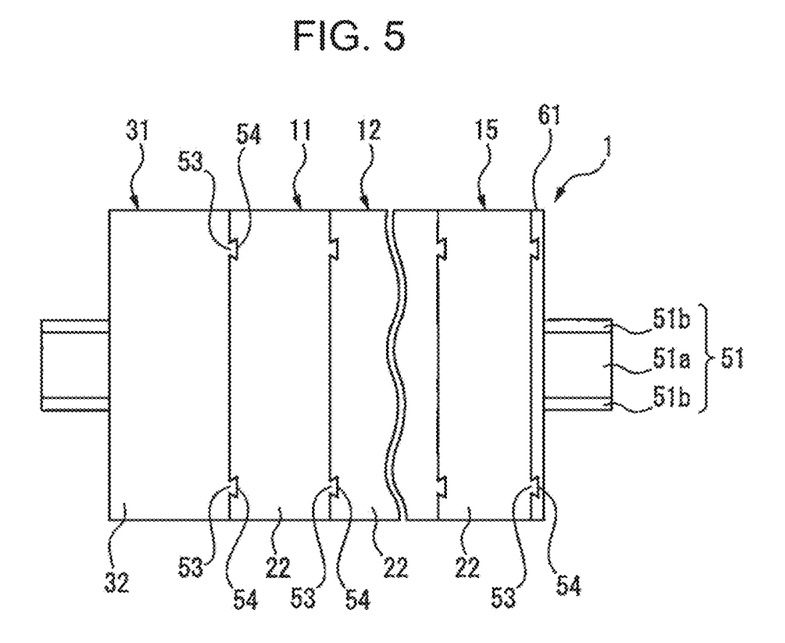
FIG. 5 is a schematic plan view of an electrical apparatus describing a structure for fixing electrical devices to each other.

FIG. 5 is a schematic plan view of the first electrical apparatus according to the present embodiment. Referring to FIGS. 2, 3 and 5, each of the electrical devices 11 to 15 includes a case 22. A projection 53 is formed on one of the surfaces, which comes into contact with another electrical device, of the case 22. A recess 54 is formed on a surface opposite to the surface on which the projection 53 is formed. The projection 53 of the electrical device is fitted into the recess 54 of the adjacent electrical device. The fan unit 31 includes a case 32. A projection 53 is formed on the case 32. The projection 53 is formed so as to be fitted into a recess 54 formed in the case 22 of the electrical device 11. The recess 54 is formed in a closing member 61 described later. The recess 54 is formed so as to be fitted into the projection 53 of the electrical device 15.

In this manner, the plurality of electrical devices 11 to 15, the fan unit 31, and the closing member 61 are fixed in contact with each other by fitting the projection and the recess. Additionally, the fixing mechanism for fixing the electrical devices 11 to 15, the fan unit 31, and the closing member 61 to each other is not limited to this structure, and any mechanism can be adopted. The fixing mechanism allows to configure a stacked body of the electrical devices 11 to 15 and the fan unit 31.

Each of the electrical devices 11 to 15 has an electrode 72 formed in a surface that contacts an adjacent electrical device. The electrodes 72 of the electrical devices 11 to 15 adjacent to each other are in contact with each other. Further, the fan unit 31 includes the electrode 72 formed in a surface that comes into contact with the electrical device 11. The electrode 72 of the electrical device 11 and the electrode 72 of the fan unit 31 are in contact with each other. The plurality of electrodes 72 include, for example, an electrode of 0V, an electrode to which a voltage is applied in order to supply electricity, and an electrode for communication. The electrical device 12 as a power supply unit supplies electricity to the electrical devices 11, 13 to 15 and the fan unit 31 via the electrodes 72.

The electrical device 11 as a communication unit transmits and receives signals to and from the electrical devices 13 to 15 and the fan unit 31 via the electrodes 72. For example, a signal from the controller 2 is received by the electrical device 11 as a communication unit. Then, a signal is transmitted to an electrical device that functions as an output unit through the electrode 72 which forms a path for transmitting a signal. For example, when the electrical device 14 is an output unit, a command from the controller 2 is transmitted to the electrical device 14 via the electrode 72 formed in the electrical device 12 and the electrode 72 formed in the electrical device 13.

An electric circuit board on which an integrated circuit, a resistor, or the like are arranged is disposed inside each of the electrical devices 11 to 15. Such an electric circuit board generates heat when driven. That is, each of the electrical devices 11 to 15 generates heat when driven. The electrical apparatus 1 according to the present embodiment has a structure for cooling the electrical devices 11 to 15.

Figure 6:
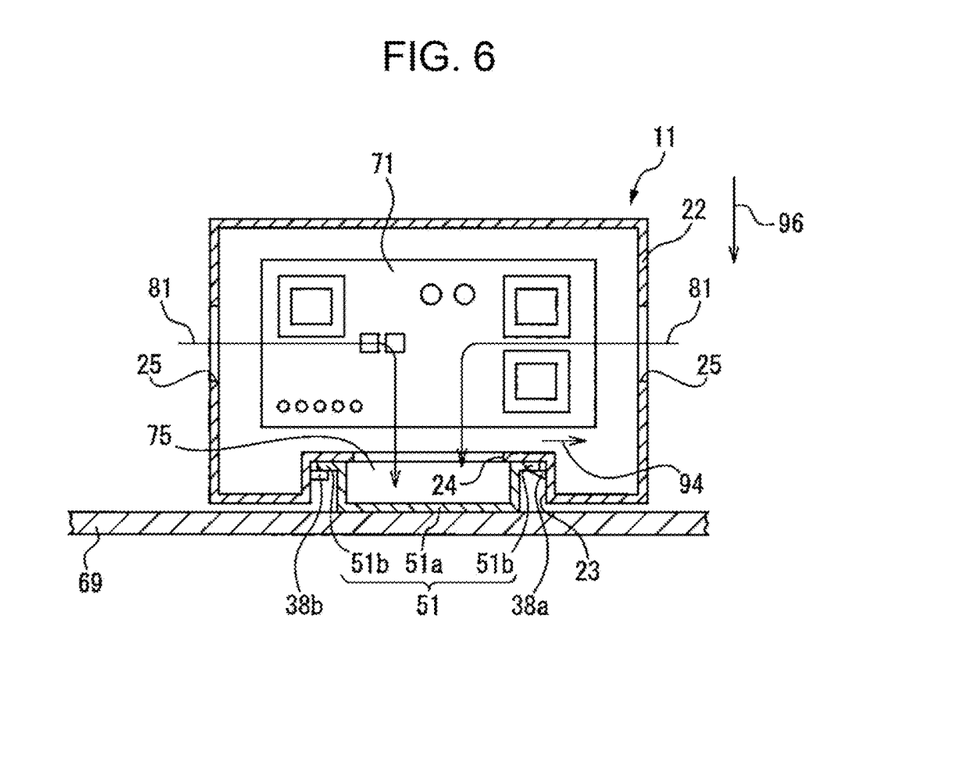
FIG. 6 is an enlarged cross-sectional view of a first electrical device and a support rail according to an embodiment.

FIG. 6 illustrates a schematic cross-sectional view of one electrical device according to the present embodiment. FIG. 6 illustrates an electrical device 11. Referring to FIGS. 2, 3 and 6, an electric circuit board 71 is disposed inside the electrical device 11. The case 22 of the electrical device 11 includes a recess 23 in which the support rail 51 is disposed. The support rail 51 is disposed inside the recess 23. The overhang portion 51b of the support rail 51 is in contact with a bottom surface 23a of the recess 23.

The case 22 has locking claws 38a and 38b for fixing the overhang portion 51b of the support rail 51. The locking claw 38a is formed so as to have a triangular cross-sectional shape. The locking claw 38a is formed so as to move toward the inside of the case 22 as illustrated by an arrow 94. The locking claw 38a is biased toward the outside of the case 22. The locking claw 38b is fixed to the main body of the case 22.

When the electrical device 11 is fixed to the support rail 51, the electrical device 11 is moved toward the support rail 51 so that the support rail 51 is disposed inside the recess 23. Then, the overhang portion 51b is inserted between the locking claw 38b and the bottom surface 23a of the recess 23. Next, as illustrated by an arrow 96, the case 22 is pressed toward the support rail 51. The locking claw 38a moves in a direction indicated by the arrow 94. The overhang portion 51b is disposed between the locking claw 38a and the bottom surface 23a of the recess 23.

In this manner, the electrical device 11 can be fixed to the support rail 51. The other electrical devices 12 to 15 and the fan unit 31 can also be fixed to the support rail 51 by the same structure. The structure to be fixed to the support rail 51 is not limited to this embodiment, and any structure can be adopted.

The case 22 of each of the electrical devices 11 to 15 has a first opening 24 formed in the bottom surface 23a of the recess 23. The first opening 24 is formed in a surface facing the support rail 51. The case 22 of each of the electrical devices 11 to 15 has a second opening 25 formed in a surface that is in contact with a space outside the electrical devices 11 to 15. The second opening 25 is formed in a surface that is different from a surface facing the housing 69 of the control panel 3 and different from a surface that comes into contact with another electrical device. That is, the second opening 25 is formed such that the space inside the case 22 communicates with the space inside the housing 69 of the control panel 3. In the present embodiment, the second opening 25 is formed in a side surface that extends vertically.

The case 32 of the fan unit 31 has a third opening 34 formed in a bottom surface 33a of a recess 33. The opening 34 is formed in a surface facing the support rail 51. In addition, the case 32 of the fan unit 31 has a fourth opening 35 formed in a surface that contacts a space outside the fan unit 31. The fourth opening 35 is formed in the surface being other than a surface that contacts the electrical device 11 and the surface that faces the housing 69 of the control panel among the surfaces of the case 32. That is, the fourth opening 35 is formed such that the space inside the case 32 communicates with the space inside the housing 69 of the control panel 3. The fan 37 according to the present embodiment is disposed so as to face the opening 35. The fan 37 is disposed so that air can be blown out from the opening 35.

The recesses 23 of the cases 22 of the electrical devices 11 to 15 according to the present embodiment are formed to have the same size. The recess 33 of the case 32 of the fan unit 31 is formed so as to have the same size as the recesses 23 of the cases 22 of the electrical devices 11 to 15. When the electrical devices 11 to 15 are fixed to the support rail, a space sandwiched between the recesses 23 of the cases 22 and the support rail 51 forms an air flow path 75. When the fan unit 31 is fixed to the support rail 51, a space sandwiched between the recess 33 of the case 32 and the support rail 51 forms the air flow path 75. In the present embodiment, the linear air flow path 75 is formed along the support rail 51.

The space inside the case 22 of each of the electrical devices 11 to 15 communicates with the air flow path 75 via the opening 24. The space inside the case 32 of the fan unit 31 communicates with the air flow path 75 via the opening 34.

The recesses 23 of the electrical devices 11 to 15 and the recess 33 of the fan unit 31 may have sizes that are different from each other. The recesses 23, 33 may be formed as long as the spaces surrounded by the support rail 51 and the recesses 23, 33 communicate with each other.

In the electrical apparatus 1 according to the present embodiment, both ends of the air flow path 75 in the extending direction are formed so as to be closed. The electrical apparatus 1 includes the closing member 61 disposed at an end of the stacked body of the electrical devices 11 to 15. The closing member 61 according to the present embodiment is formed in a plate shape. The closing member 61 includes a closing portion 61a that closes an end of the air flow path 75. The closing member 61 is fixed to the electrical device 15. The case 32 of the fan unit 31 includes a closing portion 36 that closes an end of the air flow path 75. The closing portion 36 is formed so as to close one end of the recess 33. The closing portions 61a and 36 can prevent air from being sucked from the space outside the electrical apparatus 1 into the flow path 75 and prevent air from flowing out from the flow path 75 into the space outside the electrical apparatus 1.

The member for closing the end of the air flow path is not limited to the above configuration. Both ends of the air flow path may be closed by at least one member of a case of the electrical device, a case of the fan unit, and a closing member that closes the air flow path. For example, the closing portion may be formed in the case 22 of the electrical device 15 that is disposed at the end portion of the stacked body of the electrical devices 11 to 15. Alternatively, a closing member having a closing portion may be fixed to the end face of the fan unit 31.

When the fan 37 of the fan unit 31 is driven, air flows into the case 22 from the opening 25 of each of the electrical devices 11 to 15 as illustrated by an arrow 81. The air inside the case 22 flows into the air flow path 75 from the opening 24 of the case 22 as illustrated by an arrow 82. The air passes through the air flow path 75 and flows out from the opening 34 into the case 32 of the fan unit 31. The air inside the case 32 of the fan unit 31 is discharged from the opening 35 as illustrated by an arrow 83.

As described above, in the electrical apparatus 1 according to the present embodiment, the flow of air can be generated inside the electrical devices 11 to 15 by driving the fan 37. It is possible to effectively cool components such as the electric circuit board 71 that is disposed inside the electrical devices 11 to 15. That is, the electrical apparatus 1 is excellent in the ability to cool the electrical devices 11 to 15. Further, in the electrical apparatus 1, since the space between the support rail 51 and the cases 22 of the electrical devices 11 to 15 is used as the air flow path 75, it is possible to suppress an increase in size of the electrical apparatus.

Further, in the first electrical apparatus 1, the electrical devices 11 to 15 are stacked in the vertical direction. For this reason, the openings 25 for introducing air inside the electrical devices 11 to 15 are formed in side faces extending vertically. When the openings are formed in the upper surface and the lower surface of the electrical device, the air whose temperature has risen is discharged from the upper opening so that the air flow naturally occurs. On the other hand, when the openings 25 are formed in the side faces of the case 22 extending vertically as in the first electrical apparatus 1, it is difficult for air to flow horizontally from one opening to the other opening. In the first electrical apparatus 1 according to the present embodiment, an air can flow inside the electrical devices 11 to 15 by driving the fan 37. When the electrical devices 11 to 15 are stacked vertically, the electrical devices 11 to 15 can be effectively cooled. For this reason, it is possible to suppress derating that limits the maximum value of the current input to or current output from each electrical device. Alternatively, the limit value of the temperature of the air inside the control panel 3 can be set high.

Additionally, in the above embodiment, the fan 37 is formed so as to blow out air from the inside of the case 32 of the fan unit 31 to the outside, but the embodiment is not limited to this. The fan 37 may be configured to produce air flow in the opposite direction. That is, the fan 37 may be configured such that outside air is blown into the fan unit 31. In this case, the air passing through the air flow path 75 is discharged from the opening 25 of each of the electrical devices 11 to 15.

Furthermore, in the above-described embodiment, the fan unit 31 is disposed on the upper side of the stacked body of the electrical devices 11 to 15, but the embodiment is not limited to this. The fan unit may be disposed on the lower side of the stacked body of the electrical devices. In this case, the closing member can be disposed on the upper side of the stacked body.

Next, in each of the electrical devices 11 to 15, a flow rate adjusting member that changes the size of the opening area of the opening 24 serving as the first opening is described. By disposing the flow rate adjusting member, the flow rate of air flowing inside the electrical devices 11 to 15 can be adjusted.

Figure 7:
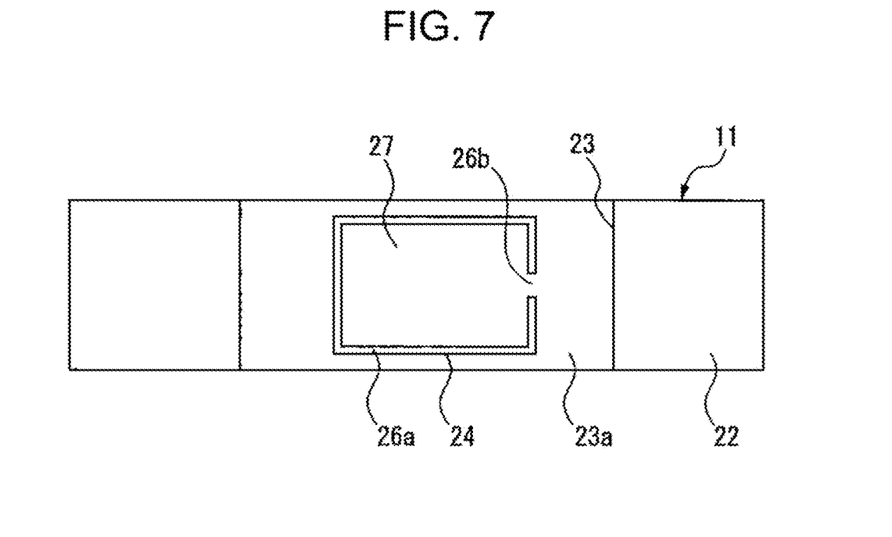
FIG. 7 is a bottom view of a second electrical device according to an embodiment.

FIG. 7 is a bottom view of the case of the electrical device for illustrating a first adjusting member according to the present embodiment. Here, the electrical device 11 is described as an example. The first flow rate adjusting member is composed of a lid member 27 that is formed so as to cover at least a portion of the opening 24. The lid member 27 is connected to the case 22 of the electrical device 11. The lid member 27 illustrated in FIG. 7 is formed so as to cover substantially the entire opening 24. The lid member 27 may be formed so as to cover a portion of the opening 24. For example, the lid member 27 may be formed so as to close half of the opening 24.

The lid member 27 is fixed to the case 22 via a connection portion 26b. An operator can cut the connection portion 26b by holding and tilting the lid member 27 outward. The operator can remove the lid member 27 from the case 22. The lid member 27 can be formed by cutting the case 22 along a cutting line 26a.

Referring to FIG. 3, in the present embodiment, the opening 24 having the same shape is formed in each of the electrical devices 11 to 15. In each of the electrical devices 11 to 15, there may be a difference in the flow rate of air. For example, the flow rate of air may be large in the electrical device 11 that is disposed near the fan unit 31. On the other hand, the flow rate of air may be small in the electrical device 15 that is disposed far from the fan unit 31. In such a case, by removing the lid member 27 of the electrical device that has a small flow rate of air, the opening area can be enlarged, whereby the air flow rate increases. In addition, the state in which the lid member 27 is attached can be maintained for an electrical device that has a large flow rate of air.

Figure 8:
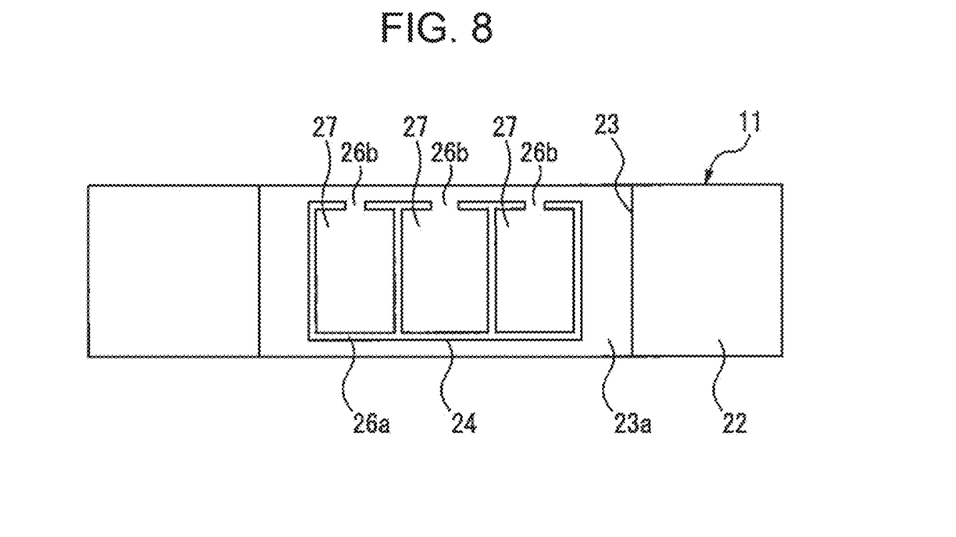
FIG. 8 is a bottom view of a third electrical device according to an embodiment.

FIG. 8 illustrates a bottom view of the case of the electrical device for illustrating a second flow rate adjusting member according to the present embodiment. The second flow rate adjusting member is constituted by a plurality of the lid members 27. Each of the lid members 27 is fixed to the case 22 via the connection portion 26b. In the example illustrated in FIG. 8, three lid members 27 are disposed in the opening 24. Each lid member 27 is formed so as to be removable from the case 22. In the second flow rate adjusting member, the size of the opening 24 can be adjusted by the number of the removed lid members 27. When the opening area of the opening 24 is increased, many lid members 27 can be removed from the case 22. By employing the second flow rate adjusting member, it is possible to finely adjust the flow rate that flows inside the electrical device.

As a method of determining the size of the opening area of the opening 24, for example, a sensor for detecting a temperature, such as a temperature sensor, can be disposed inside each of the electrical devices 11 to 15. Next, the electrical apparatus 1 is actually driven. When the temperature of the air inside the electrical devices 11 to 15 exceeds a predetermined determination value, the operation of cutting off the lid member 27 can be performed. In the second flow rate adjusting member, the temperature can be measured after cutting the lid member 27 one by one until the temperature of the air inside the electrical device becomes less than the determination value. Alternatively, the size of the opening area may be calculated based on the past record information.

Figure 9:
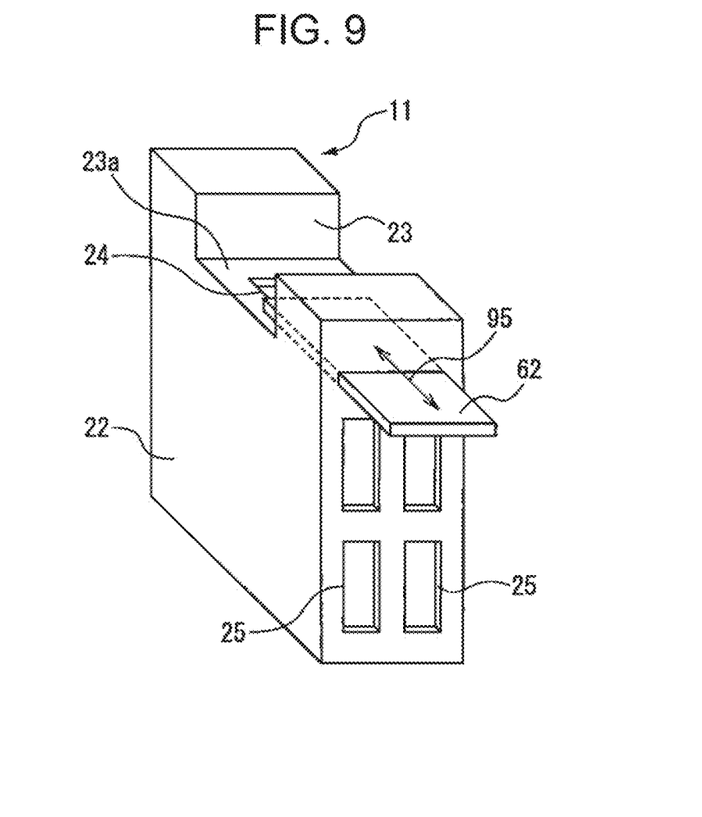
FIG. 9 is a perspective view of a fourth electrical device according to an embodiment.
Figure 10:
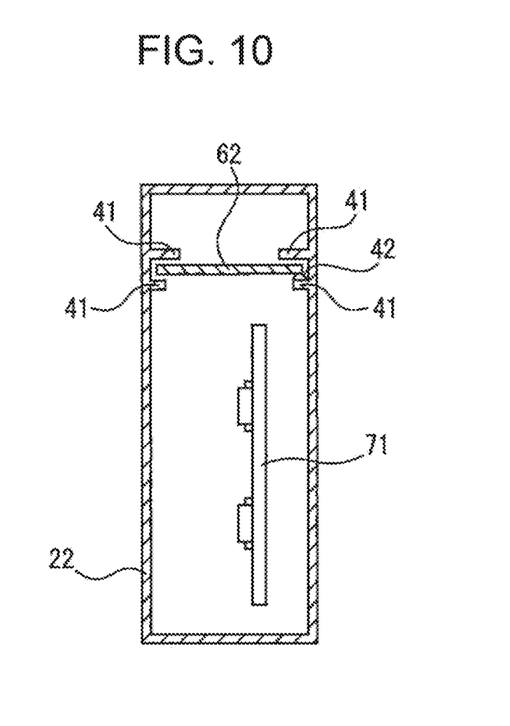
FIG. 10 is a schematic cross-sectional view of a fourth electrical device.
Figure 11:
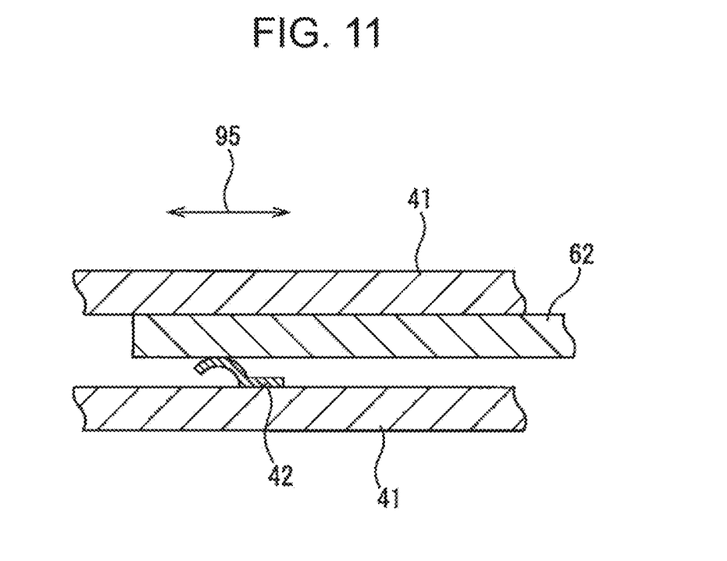
FIG. 11 is an enlarged cross-sectional view of a portion where a slide member of the fourth electrical device is arranged.

FIG. 9 illustrates a perspective view of an electrical device describing a third flow rate adjusting member according to the present embodiment. The third flow rate adjusting member includes a slide member 62 that is formed so as to move along the bottom surface 23a of the recess 23. FIG. 10 illustrates a cross-sectional view of the electrical device when cutting a portion where the slide member is disposed. FIG. 10 is a cross-sectional view taken along a direction perpendicular to the direction in which the slide member 62 extends. FIG. 11 illustrates an enlarged cross-sectional view when cutting a portion where the slide member is disposed. FIG. 11 is a cross-sectional view taken along the direction in which the slide member 62 extends.

Referring to FIGS. 9 to 11, slide member 62 is formed in a flat plate shape. The slide member 62 is formed so as to penetrate the case 22. The case 22 includes a support portion 41 that supports the slide member 62. The support portions 41 are formed so as to sandwich the slide member 62. The slide member 62 is pressed by a leaf spring 42 fixed to the support portion 41. Since the leaf spring 42 is disposed, the slide member 62 can be stopped at a desired position.

The slide member 62 is formed so as to be movable in a direction illustrated by the arrow 95. The opening area of the opening 24 can be adjusted by moving the slide member 62. As a result, the opening area of the opening 24 can be adjusted to a freely selectable size. The flow rate of air that flows through the inside of each of the electrical devices 11 to 15 can be adjusted. For example, in the electrical apparatus 1 illustrated in FIG. 3, the position of the slide member 62 may be adjusted so that the area covering the opening 24 becomes larger as located closer to the fan unit 31. The position of the slide member 62 can be determined by actually driving the electrical apparatus 1 similarly to the first flow rate adjusting member and the second flow rate adjusting member.

Referring to FIG. 3, in the first fan unit 31, the fourth opening 35 is formed in the surface opposite to the surface on which the electrical device 11 is disposed, but the embodiment is not limited to this. The fourth opening 35 can be disposed at any position where air can be discharged to a space outside the electrical apparatus.

Figure 12:
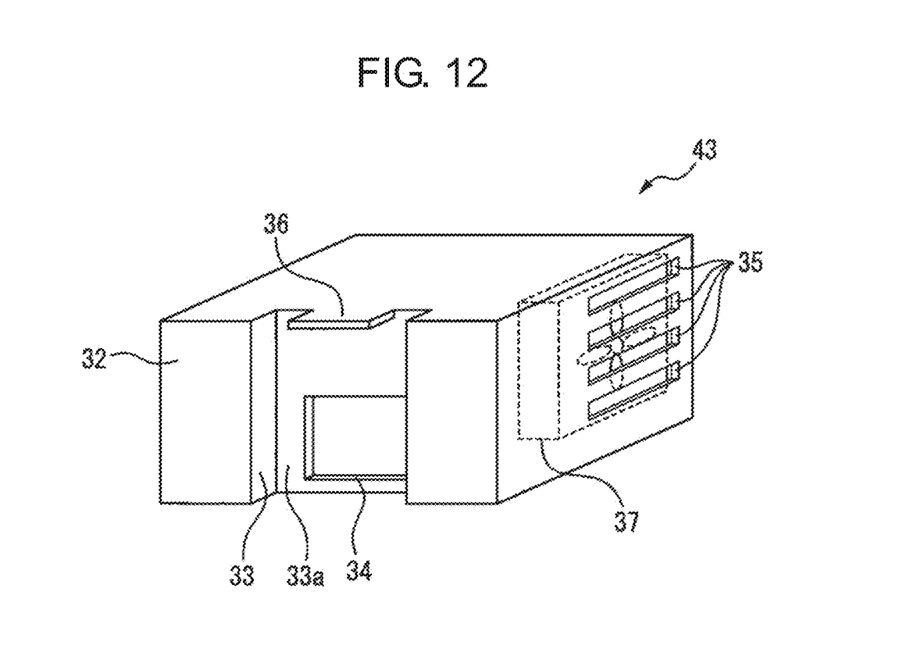
FIG. 12 is a perspective view of a second fan unit according to an embodiment.

FIG. 12 illustrates a perspective view of a second fan unit according to the present embodiment. In the second fan unit 43, the fourth opening 35 is formed in a side face extending vertically. In this case, the fan 37 can be disposed near the portion where the opening 35 is formed. The fan 37 may be disposed to discharge air from the opening 35.

Referring to FIG. 3, in the first electrical apparatus 1, the first fan unit 31 is fixed to the end face of the stacked body of the electrical devices 11 to 15, but the embodiment is not limited to this. The fan unit can be disposed at a freely selectable position of the stacked body of the electrical devices 11 to 15.

Figure 13:
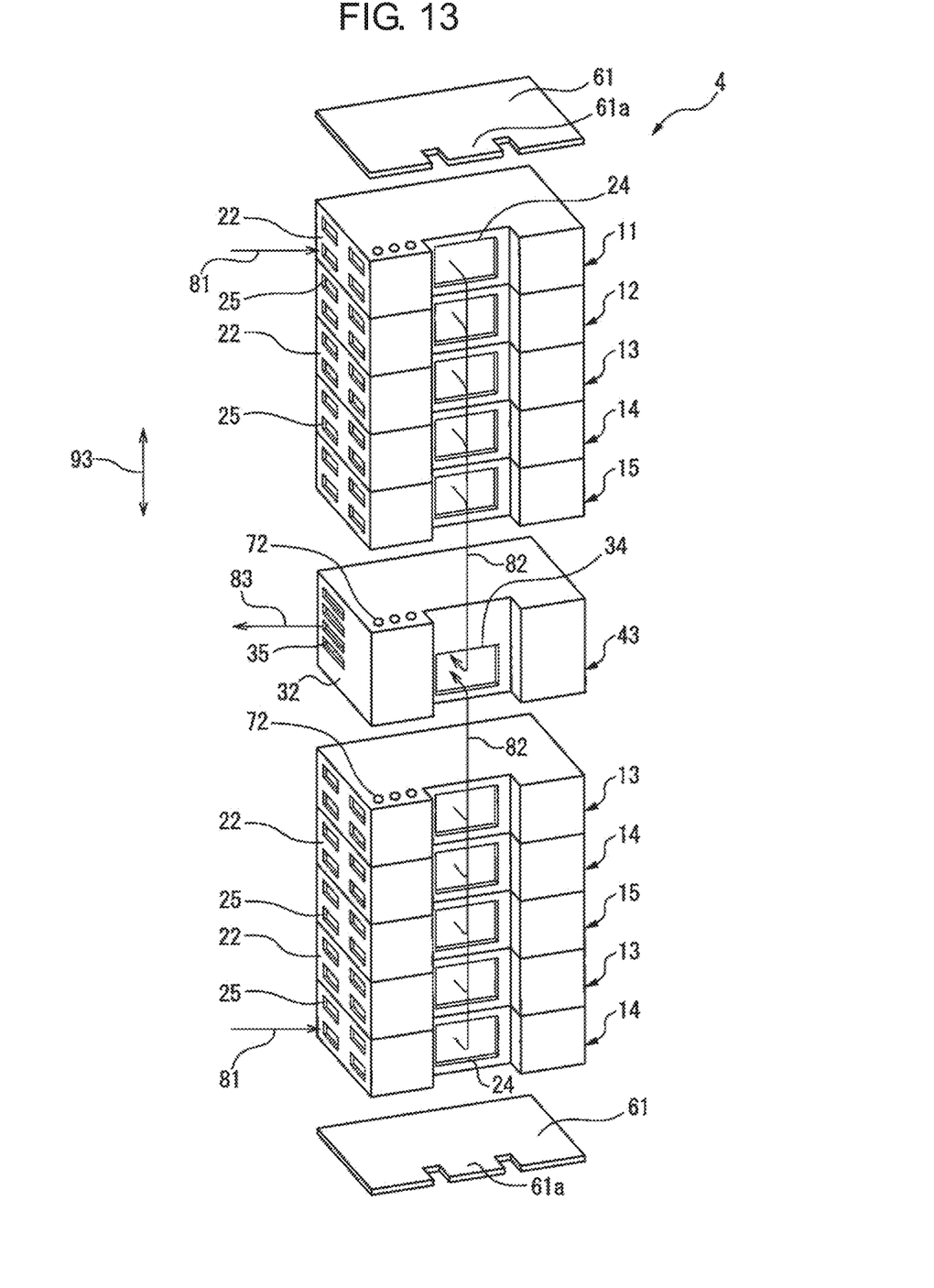
FIG. 13 is an exploded perspective view of a second electrical apparatus according to an embodiment.

FIG. 13 illustrates an exploded perspective view of a second electrical apparatus according to the present embodiment. A second electrical apparatus 4 is fixed to the support rail by the same structure as the first electrical apparatus 1. In the second electrical apparatus 4, the second fan unit 43 is disposed at the center of the stacked body of the electrical devices 11 to 15. That is, the fan unit 43 is disposed between the electrical devices 11 to 15. The case 32 of the fan unit 43 illustrated in FIG. 13 is not provided with a closing portion that obstructs the air flow. The electrodes 72 are formed on the top face and the bottom face of the case 32. The fourth opening 35 is formed in a side face that extends vertically.

In the second electrical apparatus 4, the closing member 61 is disposed on an end face of the stacked body of the electrical devices 11 to 15 disposed above the fan unit 43. Further, another closing member 61 is disposed on the other end face of the stacked body of the electrical devices 13 to 15 disposed below the fan unit 43.

When the fan unit 43 is driven, air flows in from the opening 25 of each of the electrical devices 11 to 15 as illustrated by the arrow 81. Then, as illustrated by the arrow 82, the air flows into the opening 34 of the case 32 of the fan unit 43 through the opening 24 and the air flow path. The air passes through the inside of the fan unit 43 and is discharged from the opening 35 as illustrated by the arrow 83. In this manner, the fan unit 43 may be disposed between the electrical devices 11 to 15. The fan unit 43 can be disposed at a freely selectable position of the stacked body of the electrical devices 11 to 15. In this case, it is preferable that the fan unit 43 may be disposed near an electrical device that generates a large amount of heat.

Figure 14:
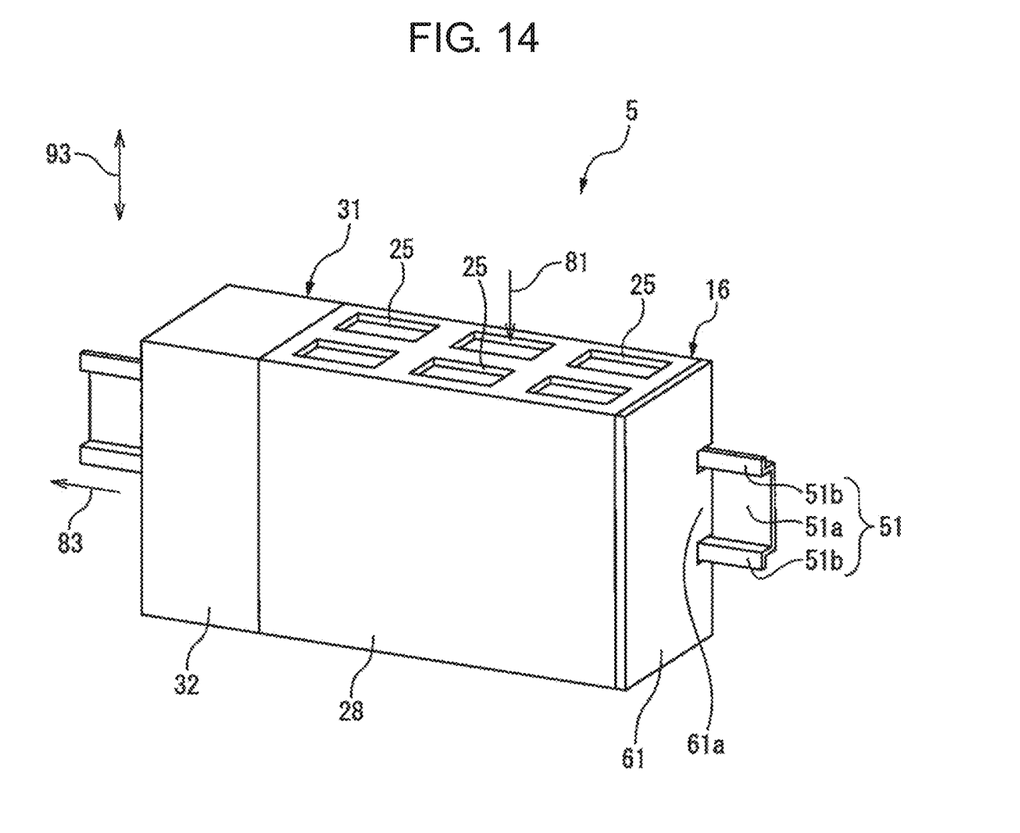
FIG. 14 is a perspective view of a third electrical apparatus according to an embodiment.

FIG. 14 illustrates a perspective view of a third electrical apparatus according to the present embodiment. A third electrical apparatus 5 includes one electrical device 16 and the fan unit 31. A PLC or an input/output unit for a motor can be illustrated as an example of the electrical device 16. The fan unit 31 is disposed on a horizontal end face of the electrical device 16. The closing member 61 is disposed on the other horizontal end face of the electrical device 16.

The electrical device 16 includes a case 28 that includes a recess in which the support rail 51 is disposed. The second opening 25 formed in the case 28 can be formed in a surface other than the surface facing the support rail 51. In the example illustrated in FIG. 14, the openings 25 are formed in the top face and the bottom face of the case 28. The other structure of the case 28 of the electrical device 16 is the same as the structure of the cases 22 of the electrical devices 11 to 15.

When the fan unit 31 is driven, air flows inside the electrical device 16 as illustrated by the arrow 81. Then, the air flows into the fan unit 31 through the air flow path sandwiched between the recess of the case 28 and the support rail 51. The air flows out of the opening formed in the fan unit 31 as illustrated by the arrow 83.

In the third electrical apparatus 5, a plurality of electrical devices are not stacked, and one electrical device and the fan unit 31 are fixed to the support rail 51. The structure according to the present embodiment can be applied to such an electrical apparatus. In particular, in the case where the amount of heat generated by the electrical device is large, the structure according to the present embodiment is suitable. In the control panel including the third electrical apparatus 5, the support rail 51 is disposed so as to extend horizontally. In this manner, the support rail may be disposed so as to extend horizontally.

According to the present disclosure, it is possible to provide an electrical apparatus that has an excellent ability to cool an electrical device, and a control panel including the electrical apparatus.

The above embodiments can be combined as appropriate. In each of the above-described drawings, the same or equivalent portions are denoted by the same reference numerals. It should be noted that the above-described embodiment is an example and does not limit the invention. In addition, the embodiments include modifications of the embodiments described in the claims.

The invention claimed is:

1. An electrical apparatus fixed to a support rail including a base part and an overhang portion extending from an end of the base part, the electrical apparatus comprising:
   an electrical device configured to generate heat when driven; and
   a fan unit including a fan configured to generate an air flow; wherein
   the electrical device includes a case having a first recess, which is recessed in a direction away from the base part of the support rail, and in which the support rail is disposed,
   the fan unit includes a case having a second recess, which is recessed in the direction away from the base part of the support rail, and in which the support rail is disposed,
   the case of the electrical device includes a first opening formed in a bottom surface of the first recess, and a second opening formed in a surface in contact with a space outside the electrical device,
   the case of the fan unit includes a third opening formed in a bottom surface of the second recess, and a fourth opening formed in a surface in contact with a space outside the fan unit,
   a first space is sandwiched between the bottom surface of the first recess of the case of the electrical device and the base part of the support rail,
   a second space is sandwiched between the bottom surface of the second recess of the case of the fan unit and the base part of the support rail,
   the first space and the second space are continuous with each other and constitute an air flow path defined by the base part and the overhang portion of the support rail and extending linearly along a longitudinal direction of the base part of the support rail in a direction between the case of the electrical device and the case of the fan unit,
   when the electrical device and the fan unit are fixed to the support rail and the fan unit is driven,
      air flows through the air flow path linearly from the first opening of the electrical device toward the third opening of the fan unit, or
      air flows through the air flow path linearly from the third opening of the fan unit toward the first opening of the electrical device,
   both ends of the air flow path in a direction in which the air flow path extends are closed by at least one of
      (a) the case of the electrical device,
      (b) the case of the fan unit, or
      (c) a closing member configured to close the air flow path,
   the first opening and the second opening are communicated with each other through an interior of the case of the electrical device, and
   in response to the air flow created by the fan, air is caused to flow through the second opening into the interior of the case of the electrical device, and then discharged from the interior of the case of the electrical device through the first opening into the air flow path along which the air flow created by the fan flows.

2. The electrical apparatus according to claim 1, comprising the closing member configured to close the air flow path, wherein the closing member is fixed to an end face of the electrical device or an end face of the fan unit.

3. The electrical apparatus according to claim 1, wherein the electrical device includes a flow rate adjusting member configured to adjust a flow rate of air by changing an opening area of the first opening.

4. The electrical apparatus according to claim 3, wherein the flow rate adjusting member includes a slide member configured to move along a bottom surface of the first recess of the case of the electrical device.

5. The electrical apparatus according to claim 3, wherein the flow rate adjusting member includes at least one lid member configured to cover at least a portion of the first opening and fixed to the case of the electrical device, and
the at least one lid member is configured to be removable from the case of the electrical device.

6. The electrical apparatus according to claim 5, wherein the at least one lid member comprises a plurality of lid members disposed in the first opening, and
each of the plurality of lid members is configured to be removable from the case of the electrical device.

7. The electrical apparatus according to claim 1, wherein the electrical device comprises a plurality of electrical devices, and
the fan unit and the plurality of electrical devices are stacked.

8. The electrical apparatus according to claim 7, wherein the fan unit is disposed between the plurality of electrical devices.

9. The electrical apparatus according to claim 1, wherein the bottom surface of at least one of the first recess or the second recess is in contact with the overhang portion of the support rail.

10. The electrical apparatus according to claim 1, wherein
the third opening and the fourth opening are communicated with each other through an interior of the case of the fan unit, and
the air flow created by the fan is caused to flow along the air flow path, then through the third opening into the interior of the case of the fan unit, and is then discharged from the interior of the case of the fan unit through the fourth opening.

11. A control panel, comprising:
   an electrical apparatus;
   a housing in which the electrical apparatus is disposed; and
   a support rail fixed to the housing, wherein
   the support rail includes:
      a base part; and
      an overhang portion extending from an end of the base part,
   the electrical apparatus comprises:
      an electrical device configured to generate heat when driven; and
      a fan unit including a fan configured to generate an air flow,
   the electrical device includes a case having a first recess, which is recessed in a direction away from the base part of the support rail, and in which the support rail is disposed,
   the fan unit includes a case having a second recess, which is recessed in the direction away from the base part of the support rail, and in which the support rail is disposed,
   the case of the electrical device includes a first opening formed in a bottom surface of the first recess, and a second opening formed in a surface in contact with a space outside the electrical device, the case of the fan unit includes a third opening formed in a bottom surface of the second recess, and a fourth opening formed in a surface in contact with a space outside the fan unit, a first space is sandwiched between the bottom surface of the first recess of the case of the electrical device and the base part of the support rail, a second space is sandwiched between the bottom surface of the second recess of the case of the fan unit and the base part of the support rail, the first space and the second space are continuous with each other and constitute an air flow path defined by the base part and the overhang portion of the support rail and extending linearly along a longitudinal direction of the base part of the support rail in a direction between the case of the electrical device and the case of the fan unit, when the electrical device and the fan unit are fixed to the support rail and the fan unit is driven, air flows through the air flow path linearly from the first opening of the electrical device toward the third opening of the fan unit, or air flows through the air flow path linearly from the third opening of the fan unit toward the first opening of the electrical device, both ends of the air flow path in a direction in which the air flow path extends are closed by at least one of (a) the case of the electrical device, (b) the case of the fan unit, or (c) a closing member configured to close the air flow path, the third opening and the fourth opening are communicated with each other through an interior of the case of the fan unit, and the air flow created by the fan is caused to flow along the air flow path, then through the third opening into the interior of the case of the fan unit, and is then discharged from the interior of the case of the fan unit through the fourth opening.

12. The control panel according to claim 11, wherein the support rail is fixed to the housing so as to extend vertically.

13. The control panel according to claim 11, wherein the bottom surface of at least one of the first recess or the second recess is in contact with the overhang portion of the support rail.

14. The control panel according to claim 11, wherein the first opening and the second opening are communicated with each other through an interior of the case of the electrical device.

15. The control panel according to claim 14, wherein in response to the air flow created by the fan, air is caused to flow through the second opening into the interior of the case of the electrical device, and then discharged from the interior of the case of the electrical device through the first opening into the air flow path along which the air flow created by the fan flows.

* * * * *